United States Patent
Bang et al.

(10) Patent No.: US 8,183,755 B2
(45) Date of Patent: May 22, 2012

(54) FLAT PANEL DISPLAY APPARATUS AND METHOD OF MANUFACTURING THE SAME

(75) Inventors: Hyun-Chol Bang, Suwon-si (KR); Sam-Il Han, Suwon-si (KR)

(73) Assignee: Samsung Mobile Display Co., Ltd., Yongin-si, Gyeonggi-do (KR)

( * ) Notice: Subject to any disclaimer, the term of this patent is extended or adjusted under 35 U.S.C. 154(b) by 267 days.

(21) Appl. No.: 12/463,316

(22) Filed: May 8, 2009

(65) Prior Publication Data

US 2009/0309477 A1  Dec. 17, 2009

(30) Foreign Application Priority Data

Jan. 12, 2009  (KR) .......................... 10-2009-0002381

(51) Int. Cl.
*H05B 33/02* (2006.01)
(52) U.S. Cl. ....................................... 313/313; 313/498
(58) Field of Classification Search .................... 257/40, 257/72, 98–100, 642–643, 759; 313/498–512; 315/169.1, 169.3; 427/58, 64, 66, 532–535, 427/539; 428/690–691, 917; 438/26–29, 438/34, 82, 455; 445/24–25; 349/139, 158; 362/84, 800; 345/204–206
See application file for complete search history.

(56) References Cited

U.S. PATENT DOCUMENTS

| | | | |
|---|---|---|---|
| 5,422,293 A | 6/1995 | Konya | |
| 5,598,283 A | 1/1997 | Fujii et al. | |
| 5,684,546 A * | 11/1997 | Kim | 349/40 |
| 5,914,763 A * | 6/1999 | Fujii et al. | 349/149 |
| 6,310,667 B1 * | 10/2001 | Nakayoshi et al. | 349/42 |
| 2002/0105263 A1 * | 8/2002 | Kim | 313/498 |
| 2006/0244741 A1 * | 11/2006 | Kimura et al. | 345/204 |
| 2007/0131932 A1 | 6/2007 | Shin et al. | |

FOREIGN PATENT DOCUMENTS

| | | |
|---|---|---|
| JP | 05-173185 A | 7/1993 |
| JP | 07-013185 A | 1/1995 |
| JP | 07-225393 A | 8/1995 |
| KR | 10-1999-0043887 A | 6/1999 |
| KR | 10-2006-0065847 A | 6/2006 |
| KR | 10-2006-0077054 A | 7/2006 |
| KR | 10-2007-0060832 A | 6/2007 |

OTHER PUBLICATIONS

Korean Office Action dated Jul. 29, 2010 for Korean Publication No. KR10-2009-0002381 which corresponds to the captioned application.

* cited by examiner

*Primary Examiner* — Mariceli Santiago
*Assistant Examiner* — Donald Raleigh
(74) *Attorney, Agent, or Firm* — Knobbe, Martens, Olson & Bear LLP

(57) ABSTRACT

A flat panel display apparatus and a method of manufacturing the same are disclosed. In one embodiment, the flat panel display apparatus includes i) a flat panel having four peripheral sides and including a plurality of display elements, ii) a first plurality of pad electrodes formed at one or more of the four sides of the flat panel, wherein the first plurality of pad electrodes are electrically connected to at least one of the plurality of display elements, iii) a first plurality of conductive lines extending from the first plurality of pad electrodes, respectively, wherein the first plurality of conductive lines are electrically insulated from each other and iv) at least one intermediate electrode formed between two adjacent ones of the first plurality of conductive lines, wherein the at least one intermediate electrode is electrically insulated from the two adjacent conductive lines.

20 Claims, 10 Drawing Sheets

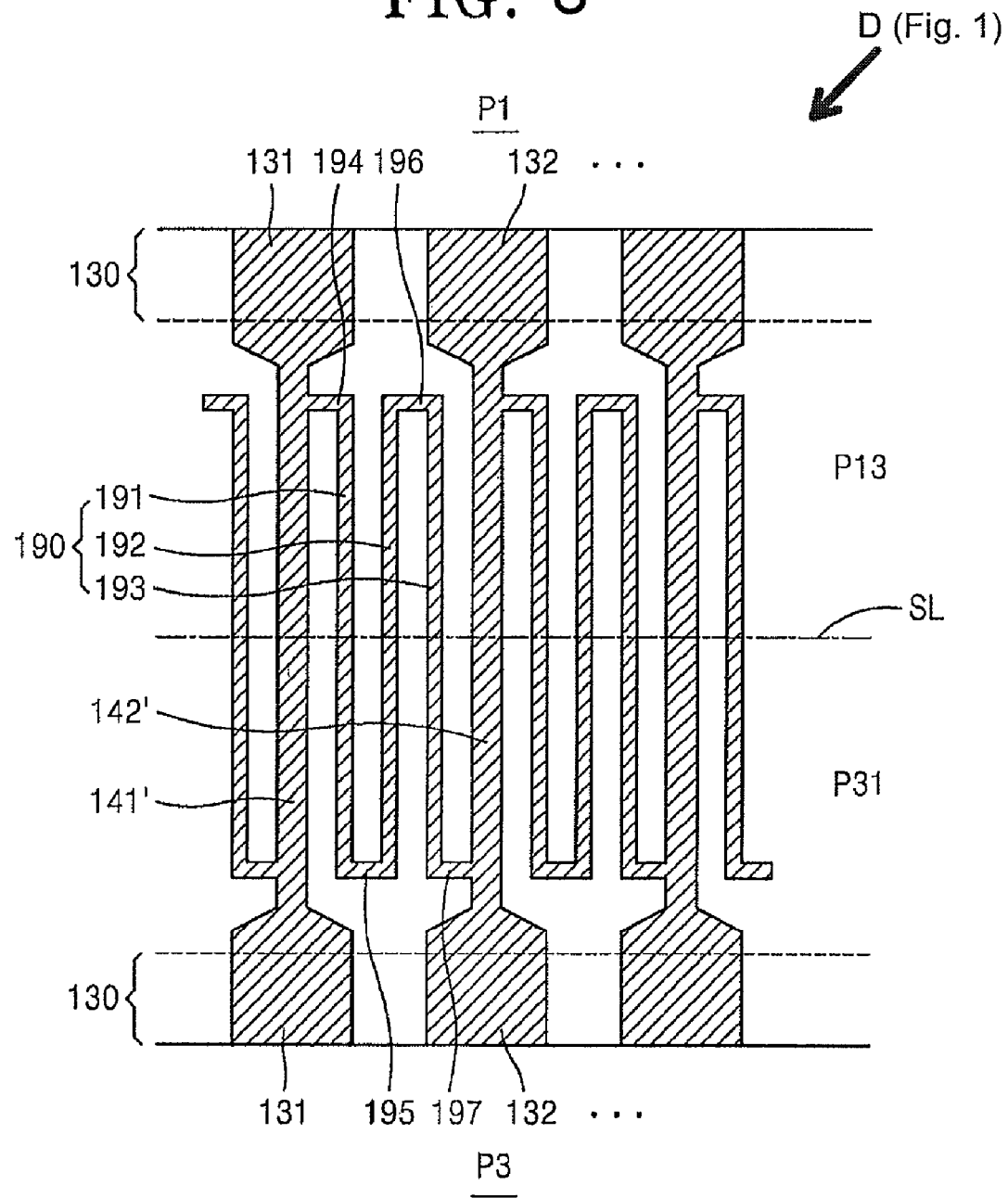

FLAT PANEL DISPLAY APPARATUS AND METHOD OF MANUFACTURING THE SAME

RELATED APPLICATIONS

This application claims priority to and benefit of U.S. provisional application No. 61/061,010 filed on Jun. 12, 2008 and Korean patent application No. 10-2009-2381 filed on Jan. 12, 2009, the entire contents of which are incorporated herein by reference.

BACKGROUND OF THE INVENTION

1. Field of the Invention

The present invention relates to a flat panel display apparatus and a mother glass including a plurality of flat display panels, and more particularly, to a flat panel display apparatus and a mother glass including a plurality of flat display panels, in which damage due to static electricity is prevented and a short circuit between channels can be prevented.

2. Description of the Related Technology

During or after manufacturing a flat panel display apparatus such as an organic light emitting display apparatus, a liquid crystal display apparatus, etc., static electricity is generated. In this regard, display devices included in the flat panel display apparatus can be damaged by static electricity. In particular, in a display apparatus including a thin film transistor, the thin film transistor is often damaged by static electricity. In order to prevent static electricity from being generated, a constant voltage is generated on a metal wiring connected to a pad electrode transmitting an external signal to a display device, thereby preventing electric charges from concentrating on one point to be discharged.

SUMMARY OF CERTAIN INVENTIVE ASPECTS

One aspect of the present invention is a flat panel display apparatus and a mother glass including a plurality of flat display panels, in which damage due to static electricity can be prevented and a short circuit between channels can be prevented. Another aspect of the present invention is a flat panel display apparatus, comprising: i) a flat panel having four peripheral sides, wherein the flat panel comprises a plurality of display elements, ii) a first plurality of pad electrodes formed at one or more of the four sides of the flat panel, wherein the first plurality of pad electrodes are electrically connected to at least one of the plurality of display elements, iii) a first plurality of conductive lines extending from the first plurality of pad electrodes, respectively, wherein the first plurality of conductive lines are electrically insulated from each other and iv) at least one intermediate electrode formed between two adjacent ones of the first plurality of conductive lines, wherein the at least one intermediate electrode is electrically insulated from the two adjacent conductive lines.

The above apparatus may further comprise a second plurality of conductive lines extending from either the first plurality of pad electrodes or the first plurality of conductive lines, respectively, wherein each of the second plurality of conductive lines is formed between two adjacent ones of the first plurality of conductive lines, and wherein each second conductive line is electrically insulated from the two adjacent conductive lines and the at least one intermediate electrode.

In the above apparatus, at least one of the second plurality of conductive lines may comprise: a connection portion extending from one of i) a respective pad electrode and ii) a respective first conductive line in a first direction which is substantially parallel to one of the sides of the flat panel and an extension portion extending from the connection portion in a second direction substantially perpendicular to the first direction.

In the above apparatus, each of the at least one intermediate electrode may comprise: two extension portions spaced apart from each other and extending in the second direction, wherein the two extension portions are substantially parallel to each other, and wherein each of the two extension portions comprise two ends and a connection portion extending in the first direction and connecting the two extension portions on each one of the two ends thereof.

In the above apparatus, the length of the two extension portions may be substantially the same as that of the extension portion of the at least one second conductive line. In the above apparatus, the width of the two extension portions may be less than that of at least one first pad electrode. The above apparatus may further comprise a flexible printed circuit board which comprises a second plurality of pad electrodes electrically connected to the first plurality of pad electrodes, respectively.

Another aspect of the present invention is a method of manufacturing a plurality Of flat panel display apparatuses, comprising: 1) providing a mother glass comprising a plurality of display panels, wherein at least two of the display panels, comprising first and second display panels, are connected to each other, wherein the first display panel is electrically connected to a first plurality of pad electrodes, wherein the second display panel is electrically connected to a second plurality of pad electrodes, wherein the first and second plurality of pad electrodes are connected to each other via a first plurality of wiring portions, respectively, and wherein two adjacent ones of the first plurality of wiring portions are connected to each other via at least one second wiring portion and 2) cutting the mother glass, so as to separate the at least two display panels from each other, along a first scribing line which crosses i) the first plurality of wiring portions and ii) at least one second wiring portion so that at least one intermediate electrode is formed of the at least one second conductive line, wherein the at least one intermediate electrode is electrically insulated from the two adjacent conductive lines and formed between the two adjacent pad electrodes.

The above method may further comprise providing a flexible printed circuit board comprising a third plurality of pad electrodes and electrically connecting the third plurality of pad electrodes of the flexible printed circuit board to the first plurality of pad electrodes, respectively. In the above method, all of the third plurality of pad electrodes may be aligned with all of the corresponding first plurality of pad electrodes. In the above method, at least one of the third plurality of pad electrodes may not be aligned with at least one of the corresponding first plurality of pad electrodes.

The above method may further comprise: i) forming a conductive adhesive medium between the third plurality of pad electrodes of the flexible printed circuit board and the first plurality of pad electrodes, wherein the conductive adhesive medium contains a plurality of conductive balls, ii) forming an insulation layer between the third plurality of pad electrodes of the flexible printed circuit board and the first plurality of wiring portions and iii) applying a pressure to the conductive adhesive medium so that at least part of the plurality of conductive balls penetrate into the insulation layer. The above method may further comprise: cutting the mother glass along a second scribing line which crosses i) the first plurality of conductive lines and ii) at least one second wiring portion, wherein the second scribing line deviates from the first scribing line so that a scribing error occurs.

Another aspect of the present invention is a flat panel display apparatus, comprising: i) a flat panel comprising a plurality of display elements, ii) a first plurality of pad electrodes formed at a periphery of the flat panel and electrically connected to at least one of the plurality of display elements, iii) a first plurality of conductive lines extending from the first plurality of pad electrodes, respectively, wherein the first plurality of conductive lines are electrically insulated from each other and iv) means for preventing a short circuit, wherein the preventing means is located between two adjacent ones of the first plurality of conductive lines.

In the above apparatus, a short circuit may be prevented between the flexible printed circuit board and at least one of the plurality of display elements. In the above apparatus, the preventing means may prevent a short circuit which can be generated from the misalignment between at least one of the first plurality of pad electrodes and at least one of the corresponding third plurality of pad electrodes of the flexible printed circuit board.

In the above apparatus, the preventing means may prevent a short circuit which can be generated from a pressure applied to the conductive adhesive medium which causes at least part of the plurality of conductive balls to penetrate into the insulation layer. The above apparatus may further comprise a flexible printed circuit board which comprises a second plurality of pad electrodes which are electrically connected to the first plurality of pad electrodes, respectively.

The above apparatus may further comprise: i) a conductive adhesive medium formed between the third plurality of pad electrodes of the flexible printed circuit board and the first plurality of pad electrodes, wherein the conductive adhesive medium contains a plurality of conductive balls and ii) an insulation layer formed between the third plurality of pad electrodes of the flexible printed circuit board and the first plurality of conductive lines. In the above apparatus, the means may comprise at least one intermediate electrode formed between the two adjacent conductive lines, and wherein the at least one intermediate electrode is electrically insulated from the two adjacent conductive lines.

BRIEF DESCRIPTION OF THE DRAWINGS

FIG. 8 is an enlarge image of a portion D of FIG. 1.

DETAILED DESCRIPTION OF CERTAIN INVENTIVE EMBODIMENTS

When a flexible printed circuit board on which a driver integrated circuit (IC), a controller IC, a jumper IC, etc., are mounted is misaligned to a pad electrode of a display apparatus during bonding the flexible printed circuit board to the pad electrode, a short circuit might occur between the flexible printed circuit and a display device. When the display panel is misaligned to the flexible printed circuit board during scribing a mother glass due to scribing tolerance that is considered in order to obtain a plurality of display panels from the mother glass, a short circuit might occur between metal wirings. In addition, when a conductive adhesion connecting the flexible printed circuit board to the pad electrode passes through an insulating layer during coupling the display panel to the flexible printed circuit board due to a pressure applied to the flexible printed circuit board, a short circuit might occur between the metal wirings connected to the pad electrode.

Hereinafter, embodiments of the present invention will be described in detail by explaining exemplary embodiments of the invention with reference to the attached drawings.

Figure 1:
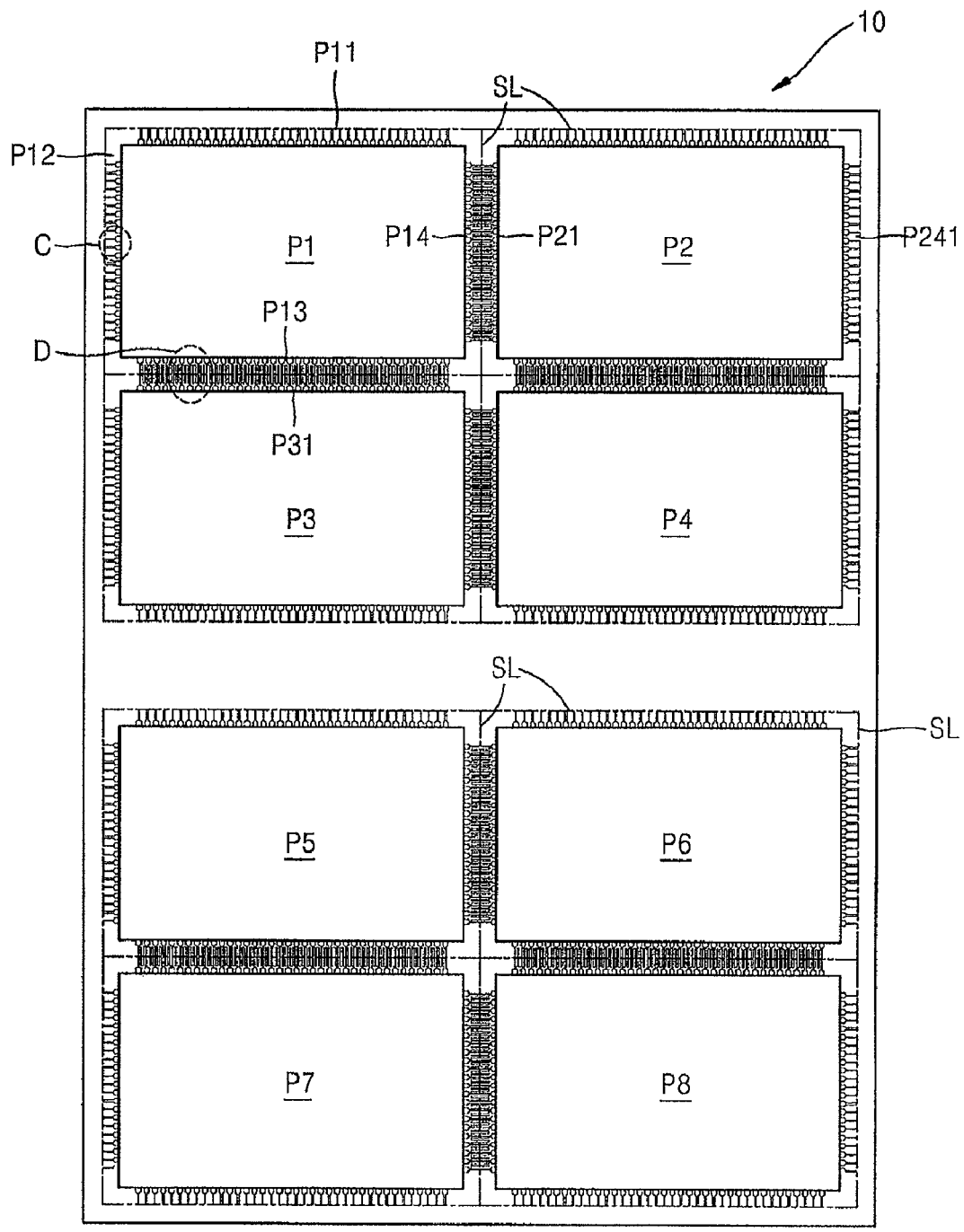
FIG. 1 is a schematic plan view of a mother glass including a plurality of display panels according to an embodiment of the present invention.
Figure 2:
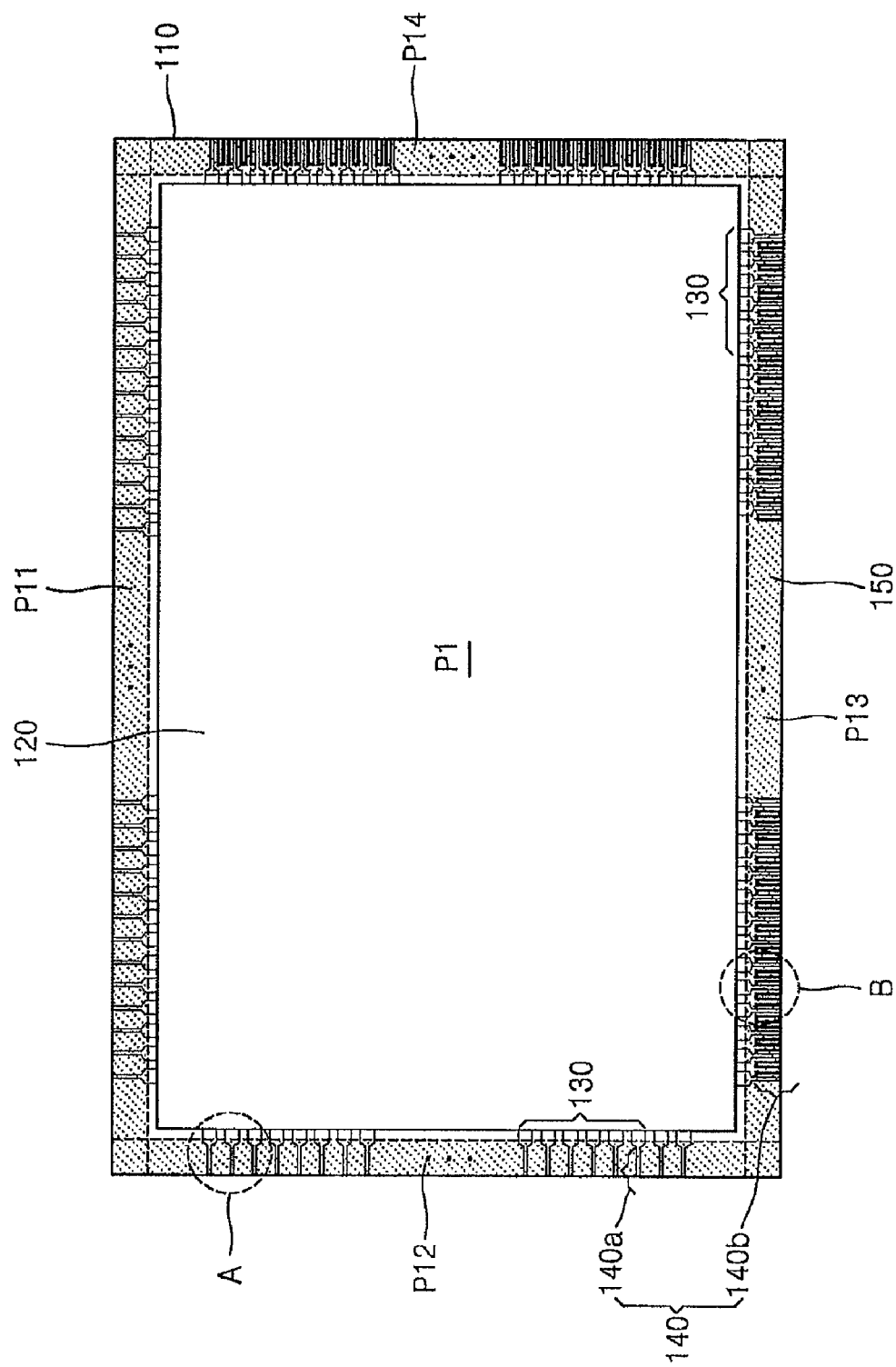
FIG. 2 is a plan view of a flat panel display apparatus according to an embodiment of the present invention.

FIG. 1 is a schematic plan view of a mother glass including a plurality of display panels according to an embodiment of the present invention. Referring to FIG. 1, a plurality of display panels P1-P8 are formed on a mother glass 10. Each of the individual display panels P1-P8 is obtained, as shown in FIG. 2, by cutting the mother glass 10 along a scribing line SL. Each of the display panels P1-P8 may be a display module. In FIG. 1, eight display panels P1-P8 are formed on the single mother glass 10. However, this is for illustrative purpose only, and the number and arrangement of display panels of the mother glass 10 may vary.

FIG. 2 is a plan view of a flat panel display apparatus according to an embodiment of the present invention. As discussed above, the flat panel display panel P1 is obtained from the mother glass 10. Referring to FIG. 2, the flat panel display panel P1 includes, among other things, i) a substrate 110, ii) a display unit 120, iii) a pad electrode portion 130, iv) a conductive line wiring portion 140 and v) an insulating layer 150.

Various display devices such as an organic light-emitting device (not shown) may be disposed on the display unit 120 of the substrate 110. Although not shown in the drawings, conductive lines (e.g., data lines or scan lines which are not shown, either) connecting the pad electrode portion 130 to the display devices, or various circuit portions (not shown) may further be disposed between the display devices and the pad electrode portion 130.

The substrate 110 may be formed of a transparent glass material primarily including $SiO_2$. Alternatively, an opaque material may be used for forming the substrate 110. Also, other materials such as plastic or metal may be used. In the meantime, a buffer layer (not shown) formed of $SiO_2$ and/or $SiN_x$ may further formed on the substrate 110 in order to make the substrate 110 smooth and to prevent the penetration of impurities.

The display unit 120 is disposed on the substrate 110. The pad electrode portion 130 includes a plurality of pad electrodes 131, 132, . . . (see FIGS. 7-9, 10 and 12) and is disposed at an end of the display unit 120. The conductive line wiring portion 140 includes a plurality of conductive lines and is disposed between the pad electrode portion 130 and an end of the substrate 110. The insulating layer 150 is disposed on the conductive line wiring portion 150.

The pad electrode portion 130 includes the pad electrodes 131, 132, . . . and is disposed at the periphery of the display unit 120. The pad electrode portion 130 may be disposed at all four end portions P11, P12, P13 and P14 of a display panel P1 as shown in FIG. 2. Alternatively, the pad electrode portion 130 may be disposed at least one end selected from among the end portions P11-P14.

The pad electrodes 131, 132, . . . constitute the pad electrode portion 130. Each of the pad electrodes 131, 132, . . . may be connected to various conductive lines (not shown) so as to transfer external signals to the display unit 120 via the connected conductive lines. The conductive lines may include a data line, a scan line, a power supply line and other lines which are used to drive display elements included in the display unit 120, The pad electrodes 131, 132, . . . may each have the same or substantially the same line width and may be spaced a predetermined interval apart from each other.

A flexible printed circuit board (see FIG. 3), on which various circuit devices such as a driver integrated circuit (IC), a controller IC, a jumper IC, etc., are mounted, is coupled to the pad electrode portion 130 so as to transfer an electric signal input from an external element to the display devices included in the display unit 120.

The conductive line wiring portion 140 extends from ends of the pad electrodes 131, 132, . . . to the end of the substrate 110. The wiring portion 140 is disposed at the ends of the pad electrodes 131, 132, . . . of the pad electrode portion 130. For convenience, the width and length of the conductive line wiring portion 140 are exaggerated for convenience of description.

The conductive line wiring portion 140 includes conductive line sub-wiring portions 140a and 140b. The conductive line sub-wiring portion 140a includes conductive lines 141 and 142 extending from the pad electrodes 131, 132, . . . to the end of the substrate 110. The sub-wiring portion 140a may be disposed on each of the upper end portion P11 and the left end portion P12 of the display panel P1. The conductive line sub-wiring portion 140b includes first, second and third conductive lines 141, 145, 149. The sub-wiring portion 140b may be disposed on each of the lower end portion P13 and the right end portion P14 of the display panel P1.

The conductive line sub-wiring portions 140a and 140b are merely examples, and are not intended to limit the scope of the present invention. For example, as long as the conductive line sub-wiring portion 140b is disposed on at least one of the upper, left, lower and right end portions P11, P12, P13 and P14 of the display panel P1, the conductive line wiring portion 140b may be disposed on all or three of the portions P11-P14 of the display panel P. In this situation, the pad electrode portion 130 is disposed and the conductive line wiring portion 140a including a single conductive line is disposed on the remaining end portion of the portions P11-P14.

Prior to scribing the mother glass 10 shown in FIG. 1, the pad electrode portions 130 connected to the pad electrode portions 161 (see FIG. 3) of the flexible printed circuit boards 160 (see FIG. 3) are formed on end portions of the display panels P1-P8 formed on the mother glass 10 (see FIG. 1). At this time, if conductive pad electrode portions 130 float, static electricity is generated, thereby damaging display devices. In one embodiment, in order to prevent such static electricity, a constant voltage is formed on the pad electrode portion 130, thereby preventing electric charges from concentrating on one point to be momentarily discharged.

According to one embodiment, the mother glass 10 is formed such that pad electrodes constituting the pad electrode portion 130, which are included in each of the display panel P1-P8, are connected to conductive lines. By connecting the conductive lines, a constant voltage is formed on the pad electrodes and the conductive lines, thereby preventing static electricity from being generated.

Figure 3:
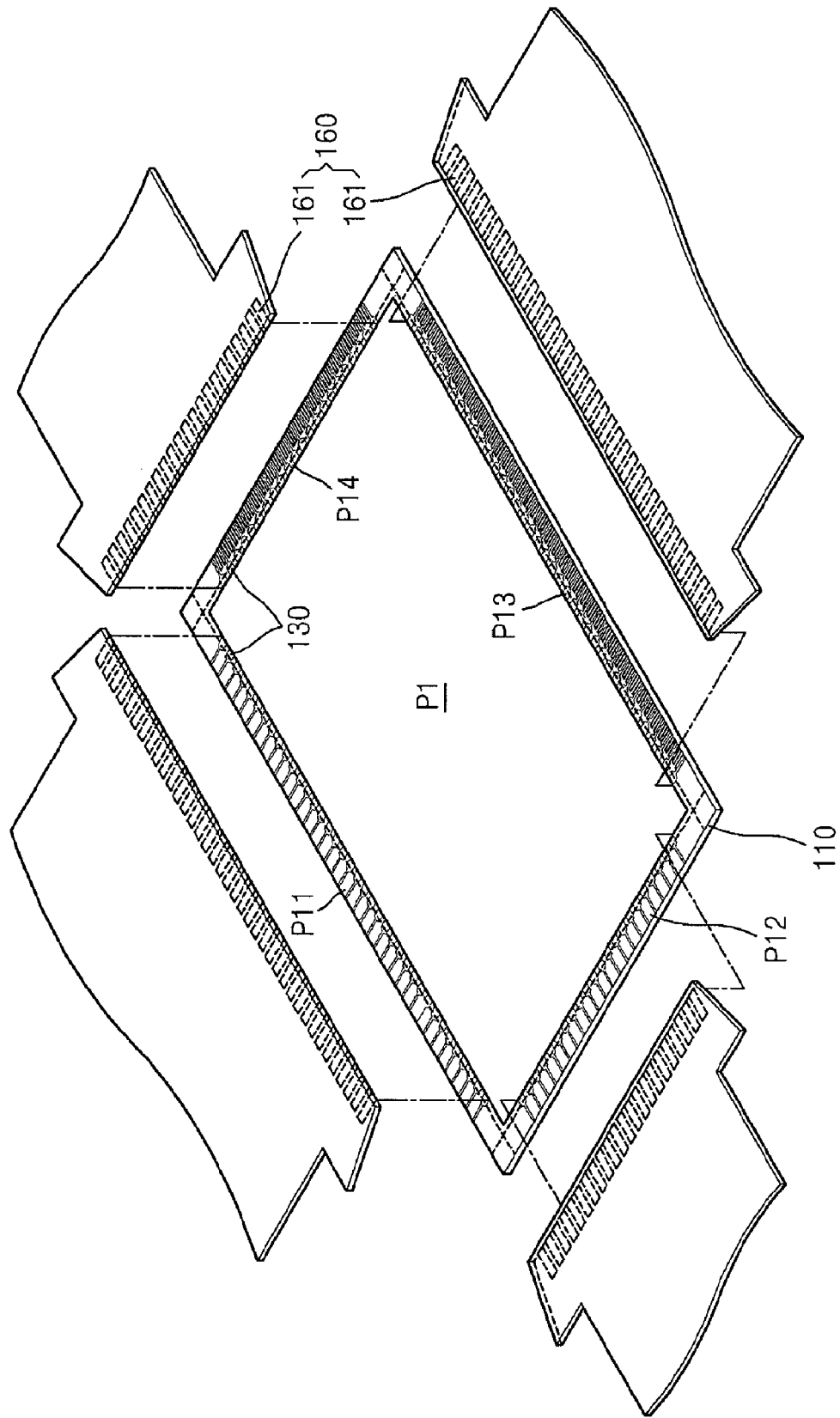
FIG. 3 is a schematic perspective view for illustrating how a display panel is connected to a plurality of flexible printed circuit boards, according to an embodiment of the present invention.
Figure 4:
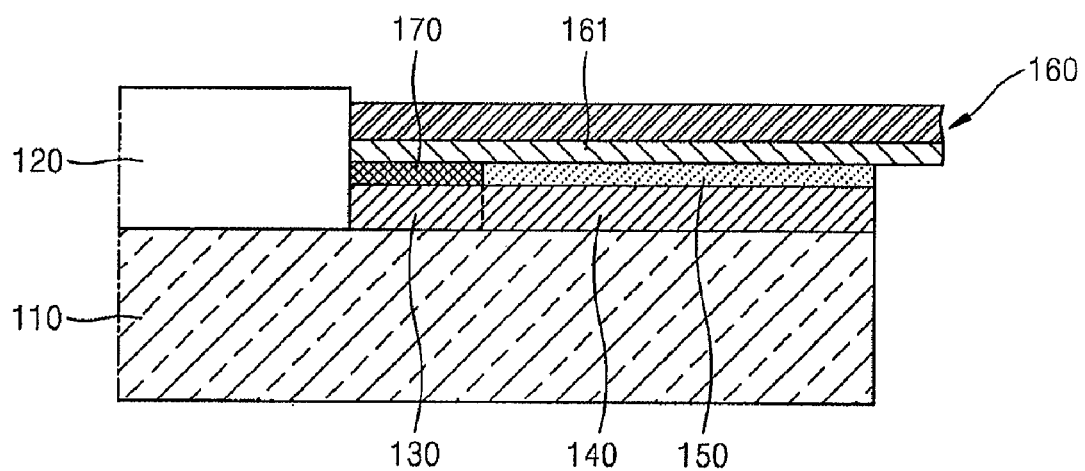
FIG. 4 is a cross-sectional view of the case where the display panel is connected to the flexible printed circuit board of FIG. 3.

FIG. 3 is a schematic perspective view for illustrating how a display panel P1 is connected to a plurality of flexible printed circuit boards 160, according to an embodiment of the present invention. FIG. 4 is a cross-sectional view of the case where the display panel P1 is connected to the flexible printed circuit boards 160 of FIG. 3.

Referring to FIGS. 3 and 4, the flexible printed circuit boards 160 are respectively connected to four pad electrode portions 130, which are respectively formed on four end portions P11-P14 of the display panel P1. Alternatively, the flexible printed circuit boards 160 do not have to be connected to all of the pad electrode portions 130. For example, the circuit boards 160 may be selectively connected to some pad electrode portions 130 from among the pad electrode portions 130, if necessary. In addition, in FIGS. 3 and 4, the flexible printed circuit boards 160 are independently coupled to the pad electrode portion 130, but the present invention is not limited thereto. For example, an integrated flexible printed circuit board may be coupled to the pad electrode portion 130. In addition, the shapes of the flexible printed circuit boards 160 may vary.

The display panel P1 may be coupled to the flexible printed circuit board 160 as follows (see FIG. 4). A conductive adhesion medium 170 including conductive balls is coated on a pad electrode portion 161 of the flexible printed circuit board 160. Pad electrodes of the pad electrode portion 161 of the flexible printed circuit board 160 are respectively aligned so as to have a one-to-one correspondence to pad electrodes of the pad electrode portions 130 of the display panel P1. Then, the flexible printed circuit board 160 may be hot-pressed to the display panel P1 by a bar with a heating element. Alternatively, the display panel P1 may be coupled to the flexible printed circuit boards 160 by coating the conductive adhesion medium 170 on the pad electrode portions 130 of the display panel P1.

As a result of the above structure, the pad electrode portion 130 of the display panel P1 is connected to the pad electrode portion 161 of the flexible printed circuit board 160, which includes a controller IC, a driver IC, or the like, via the conductive adhesion medium 170 of the pad electrode portion 130. The pad electrode portion 130 can transfer a signal of the flexible printed circuit board 160 to display devices. In this case, an insulating layer 150 interposed between the conductive line wiring portion 140 and the flexible printed circuit board 160 can prevent a short circuit between the conductive line wiring portion 140 and the flexible printed circuit board 160.

In the meantime, if the flexible printed circuit boards 160 are misaligned to the pad electrode portions 130 of the display panel P1 during coupling the flexible printed circuit boards 160 to the display panel P1, a short circuit might occur between the display panel P1 and the flexible printed circuit boards 160. Also, if the display panel P1 is misaligned to the flexible printed circuit board 160 during scribing a mother glass due to scribing tolerance, a short circuit might occur between the display panel P1 and the flexible printed circuit board 160. In addition, if the conductive adhesion medium 170 passes through the insulating layer 150 during coupling the display panel P1 to the flexible printed circuit boards 160 due to a pressure applied to the flexible printed circuit boards 160, a short circuit might occur between the display panel P1 and the flexible printed circuit board 16. In this regard, according to one embodiment the short circuits can be prevented, which will be described later.

Figure 5:
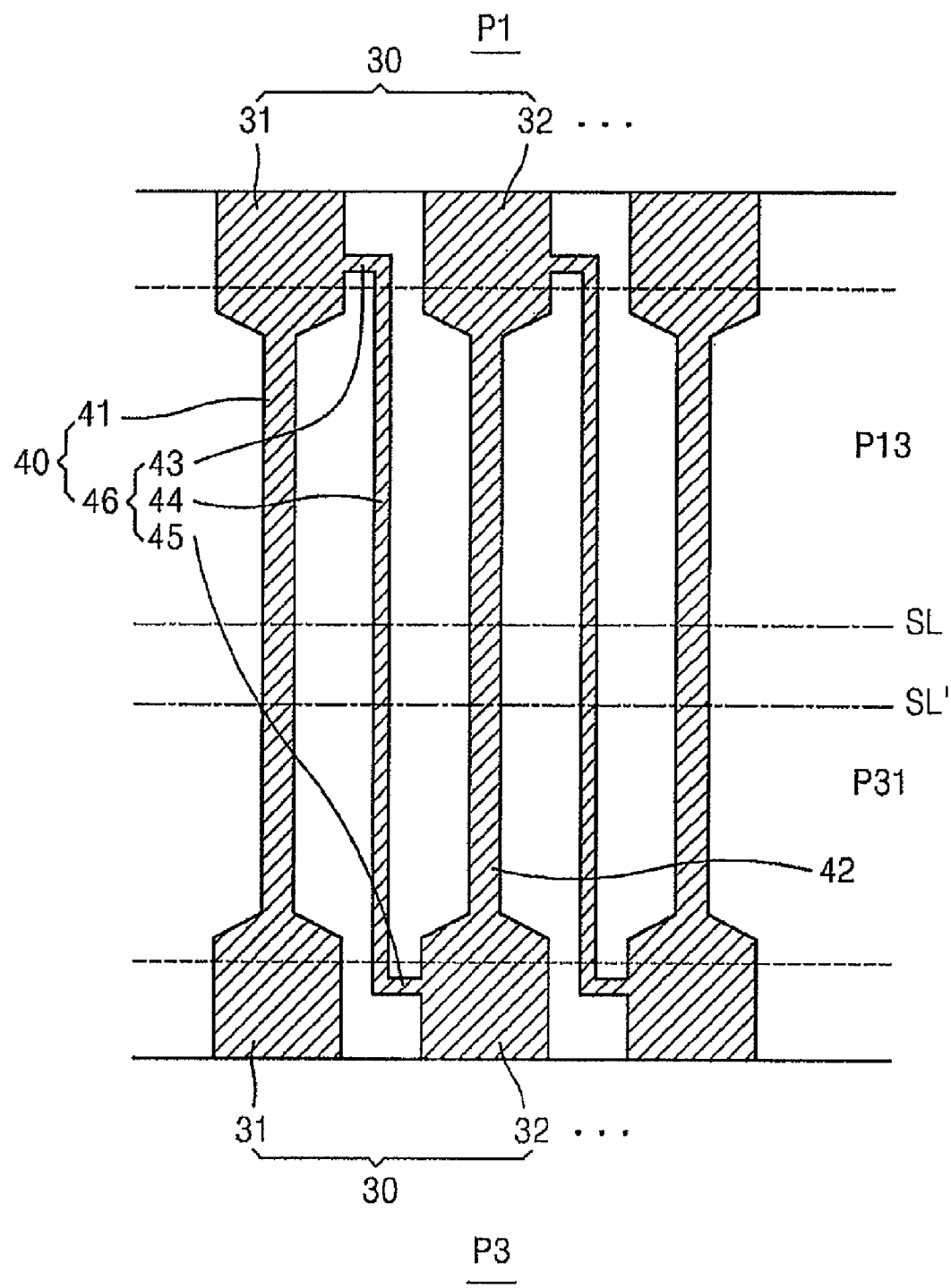
FIG. 5 is a partial view of a comparative example of a mother glass, and illustrates an enlarged image of pad electrode portions and conductive line wiring portions, which are included in adjacent first and third display panels.
Figure 6:
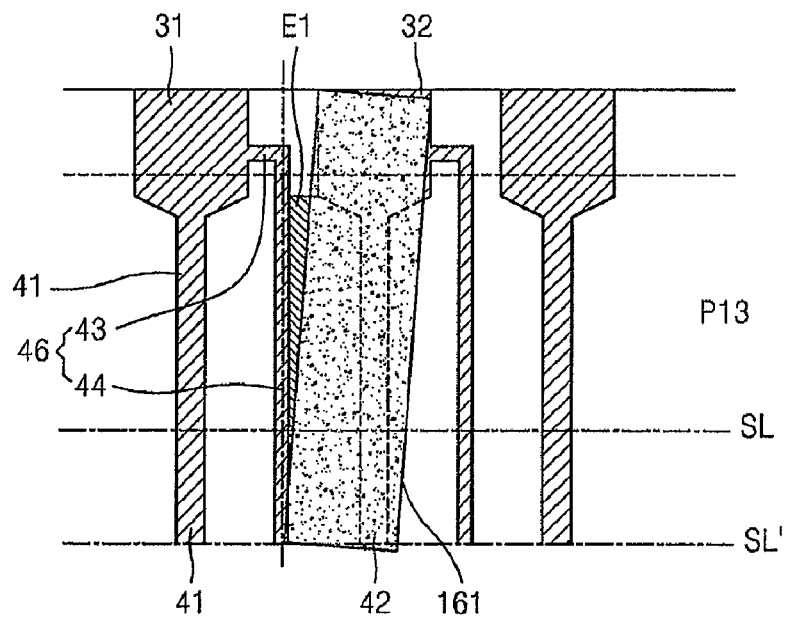
FIG. 6 is illustrates the case where a single display panel is coupled to a flexible printed circuit board after a scribing operation is performed to the mother glass, according to a comparative example.

FIG. 5 is a partial view of a comparative example of a mother glass, and illustrates an enlarged image of pad electrode portions and a conductive line wiring portion 40, which are included in adjacent first and third display panels P1 and P3. FIG. 6 illustrates the case where a single display panel is coupled to a flexible printed circuit board after a scribing operation is performed to the mother glass, where a connecting state between a pad electrode portion of the display panel and one pad electrode from among a plurality of pad electrodes of the flexible printed circuit board is emphasized.

Referring to FIGS. 5 and 6, the conductive line wiring portion 40 includes first and second wiring portions 41 and 46. The first wiring portion 41 is directly connected between upper and lower portions of the first pad electrode 31, which face each other. The second wiring portion 46 is formed between the first wiring portion 41 and an adjacent first wiring portion 42 which is adjacent to the first wiring portion 41. The adjacent first wiring portion 42 is also directly connected between upper and lower portions of the second pad electrode 32, which face each other.

The first wiring portions 41 and 42 are cut at an end of each of the first and third display panels P1 and P3, which is formed along a scribing line SL after the scribing operation. The first wiring portions 41 and 42 correspond to the first conductive line wiring portions 41 and 42 (see FIG. 6) of the first display panel P1 that is separated from the mother glass.

The first wiring portions 41 and 42 are connected to each other by the second wiring portion 46. One end of the second wiring portion 46 extends from the pad electrode 31 formed on a lower end portion P13 of the first display panel P1. The other end of the second wiring portion 46 extends to the pad electrode 32 formed on an upper end portion P31 of the third display panel P3, which is adjacent to the lower end portion P13 of the first display panel P1. At this time, the second wiring portion 46 includes a single conductive line 44 that is disposed in substantially parallel to the first wiring portion 41, and two connection lines 43 and 45 connecting the conductive line 44 to the pad electrodes 31 and 32.

The single conductive line 44 included in the second wiring portion 46 is cut at an end of each of the first and third display panels P1 and P3, which is formed along the scribing line SL after the scribing operation. The single conductive line 44 corresponds to a portion including the second conductive line 43 and 44 of the first display panel P.1 that is separated from the mother glass (see FIG. 6).

Ideally, the pad electrodes 31 and 32 disposed on the display panel P1 should have a one-to-one correspondence to and be disposed in substantially parallel to pad electrodes 161 of the flexible circuit board. In the comparative example, the pad electrodes 161 of the flexible circuit board are slightly misaligned and coupled to the second pad electrode 32 of the first display panel P1. In addition, the mother glass is cut along a new scribing line SL' that deviates from the scribing line SL due to an operational error generated during scribing.

An external signal input through the pad electrode of the flexible printed circuit board is transferred to only one pad electrode of the display panel P1. However, when the misalignment and the operational error occurs during the coupling operation as in the comparative example, the pad electrodes 161 of the flexible circuit board formed on the end of a substrate is connected to an end of the second conductive line 46 of the first pad electrode 31 and the first conductive line 42 connected to the second pad electrode 32. In this situation, the external signal input through the pad electrode of the flexible printed circuit board cannot be accurately transferred, and a short circuit occurs between channels of the pad electrodes 31 and 32 of the first display panel P1.

When the pad electrode 32 of the first display panel P1 is bonded to the pad electrodes 161 of the flexible circuit board, the conductive adhesion medium 170 (see FIG. 4) interposed between the pad electrode 32 and the pad electrode 161 is pressurized. At this time, a greater pressure is applied to the pad electrode portion 30 of the display panel P1 than to the end of the substrate of the display panel P1. In addition, a conductive ball included in the conductive adhesion medium 170 (see FIG. 4) might pass through the insulating layer 150 (see FIG. 4).

When the conductive ball passes through the insulating layer 150 (see FIG. 4) at a region E1 between the second conductive line 46 connected to the first pad electrode 31 and the pad electrode 161 of the flexible printed circuit board, the pad electrode 161 is connected to the second conductive line 46 connected to the first pad electrode 31 as shown in FIG. 6. In this situation, even if the mother glass is accurately cut along the scribing line SL without the operational error of the scribing operation, a short circuit might occur between channels of the display panel of the comparative example.

Figure 7:
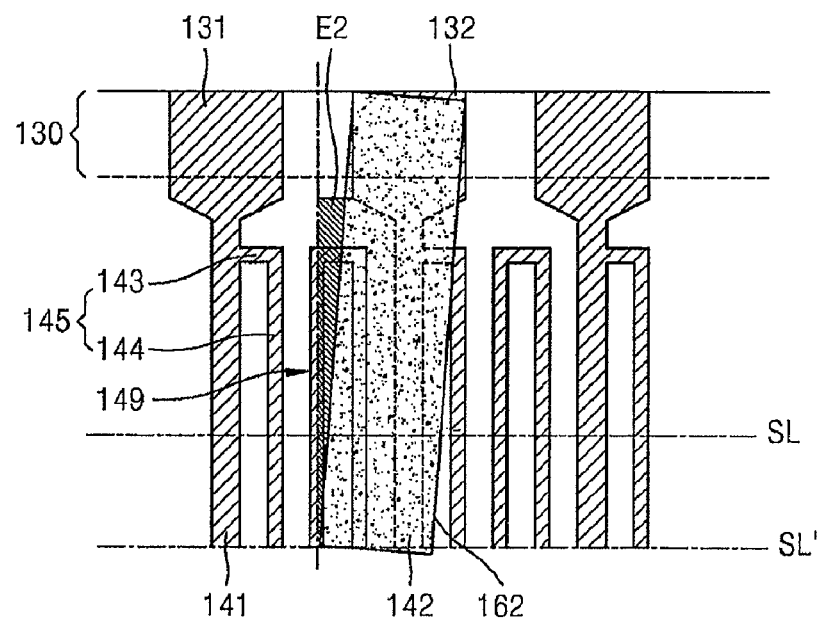
FIG. 7 is illustrates the case where a single display panel is coupled to a flexible printed circuit board after a scribing operation is performed to a mother glass, according to an embodiment of the present invention.

FIG. 7 illustrates the case where a single display panel is coupled to a flexible printed circuit board after a scribing operation is performed to a mother glass, according to an embodiment of the present invention. In FIG. 7, a connecting state between a pad electrode portion of the display panel and one pad electrode from among a plurality of pad electrodes of the flexible printed circuit board is emphasized.

In the FIG. 7 embodiment, even if the flexible printed circuit board is misaligned to the display panel during coupling the flexible printed circuit board to the display panel, and even when a new scribing line deviates from an original scribing line due to an operational error generated during a scribing operation, a short circuit does not occur between channels of the display panel.

This is because a third conductive line 149 is disposed between a second conducive line 145 connected to the first pad electrode 131 and a first conductive line 142 connected to a second pad electrode 132 and is insulated from the second line 145 and the first conductive line 142. In addition, the second conductive line 145 is farther from a second pad electrode 132 compared to the case of the second conductive line 46 of the comparative example. in this situation, despite of i) the misalignment between the flexible printed circuit board and the display panel, and ii) the scribing error, the pad electrode 162 is connected to an end of the first conductive line 142 connected to the second pad electrode 132 and the third conductive line 149. The third conductive line 149, which is a floating structure, is insulated from the first pad electrode 131 and the second pad electrode 132. Thus, even if the pad electrode 161 of the flexible printed circuit board is connected to the third conductive line 149, an external signal input through the pad electrode 161 is transferred only to the second pad electrode 132. This way, a short circuit is prevented between channels of the pad electrodes 131, 132, . . . of the display panel Pl.

In addition, when the pad electrode 132 of the display panel P1 is bonded to the pad electrode 161 of the flexible printed circuit board 160, the conductive adhesion medium 170 (see FIG. 4) interposed between the pad electrode 132 and the pad electrode 161 is pressurized. At this time, a conductive ball included in the conductive adhesion medium 170 (see FIG. 4) might pass through the insulating layer 150 (see FIG. 6).

Further, in the FIG. 7 embodiment, even if a conducive ball passes through the insulating layer 150 (see FIG. 4) at a region E2 between the third conductive line 149 and the pad electrode 16.1 of the flexible printed circuit board, since the third conductive line 149 is not connected to the first pad electrode 131 and the second pad electrode 132, a short circuit can be prevented between channels.

FIG. 8 is an enlarged image of a portion D of FIG. 1, and schematically illustrates pad electrodes 131, 132, . . . and conductive lines which are formed on a lower end portion P13 of the first display panel P1 and an upper end portion P31 of the third display panel P3.

Referring to FIG. 8, first of the pad electrodes 131, 132, . . . are formed on the lower end portion P13 of the first display panel P1, and second of the pad electrodes 131, 132, . . . are formed on the upper end portion P31 of the third display panel P3. The first of the pad electrodes 131, 132, . . . are respectively connected to the second of the pad electrodes 131, 132, . . . by first wiring portions 141' and 142', respectively. The first wiring portions 141' and 142' is cut at the end of the substrate 110 (see FIG. 1) of each of the first and second panels P1 and P3, which are formed along the scribing line SL after a scribing operation, so as to define the first conductive lines 141 and 142 of the display panel P1 (see FIG. 9).

The first wiring portions 141' and 142' are connected to each other by a second wiring portion 190. One end of the second wiring portion 190 extends from the first wiring portion 141' formed on the lower end portion P13 of the first display panel P1. The other end of the second wiring portion 190 extends to the first wiring portion 142' formed on the upper portion P31 of the third display panel P3, which is adjacent to the lower end portion P13 of the first display panel P1.

As a result of the above structure, a constant voltage is generated on the pad electrode portion 130, the first wiring portions 141' and 142' and the second wiring portion 190 of the first and third display panel P1 and P3, thereby preventing static electricity from being generated during manufacturing the first and third display panels P1 and P3.

The second wiring portion 190 may include three conductive lines 191, 192 and 193 which are disposed in substantially parallel to the first wiring portion 141', and four connection lines 194, 195, 196 and 197 connecting the three conductive lines 191, 192 and 193. The three conductive lines 191, 192 and 193 of the second wiring portion 190 are cut at an end of a substrate of each of the first and third display panel P1 and P3, which are formed along the scribing line SL after a scribing operation. After the scribing operation, a portion including the conductive line 191 and the connection line 192, which are the first closest to the first conducive line 141 of the first display panel P1, corresponds to the second conductive line 145 (see FIG. 9). Further, a portion including the conductive lines 192 and 193 which are respectively second and third closest to the first conducive line 141, and the connection line 196 connecting the conductive lines 192 and 193 correspond to the third conductive line 149 (see FIG. 9).

In one embodiment, the first wiring portions 141' and 142', and the second wiring portion 190, which directly and substantially vertically connect the first and second of the pad electrodes 131, 132, . . . i) between the panels P1 and P3, ii) between the panels P2 and P4, iii) between the panels P5 and P7, and iv) between the panels P6 and P8. However, the present invention is not limited thereto. For example, the first wiring portions 141' and 142', and the second wiring portion 190 may directly and substantially vertically connect the pad electrodes between the panels P3 and P5, and between the panels P4 and P6.

In addition, first and second wiring portions directly and substantially horizontally connect the first and second of the pad electrodes 131, 132, . . . i) between the panels P1 and P2, ii) between the panels P3 and P4, iii) between the panels P5 and P6, and iv) between the panels P7 and P8, but the present invention is not limited thereto. That is, if other display panels (not shown) are disposed on the right or left of the mother glass 10, for example, if another display panel (not shown) is further disposed on the right of the second display panel P2, a wiring portion formed on the right end portion of the second panel P2 may be substantially horizontally connected to a wiring portion (not shown) disposed on a left end portion of the display panel that is newly disposed.

Figure 11:
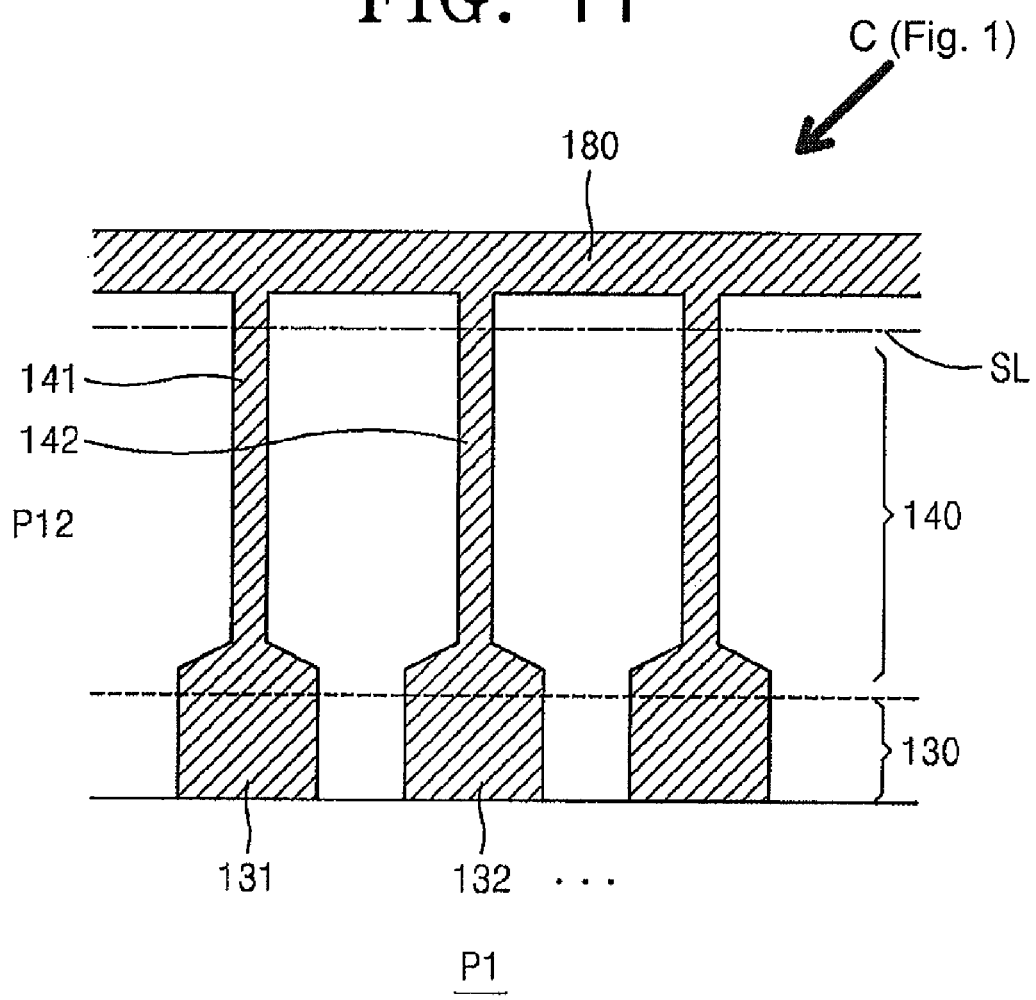
FIG. 11 an enlarged image of a portion C of FIG. 1.

In the above structure in which wiring portions of facing pad electrodes of adjacent display panel are connected to each other, since a conductive bar disposed outside the scribing line SL is not required unlike in FIG. 11, the number of display panels which can be formed on the mother glass 10 can be increased due to a spatial benefit of the mother glass 10. The shapes of the conductive lines 142 and 143 are not limited to shapes illustrated in FIG. 11. The shapes of the conductive lines 142 may vary so that the conductive lines 141 and 142 are connected to each other.

Figure 9:
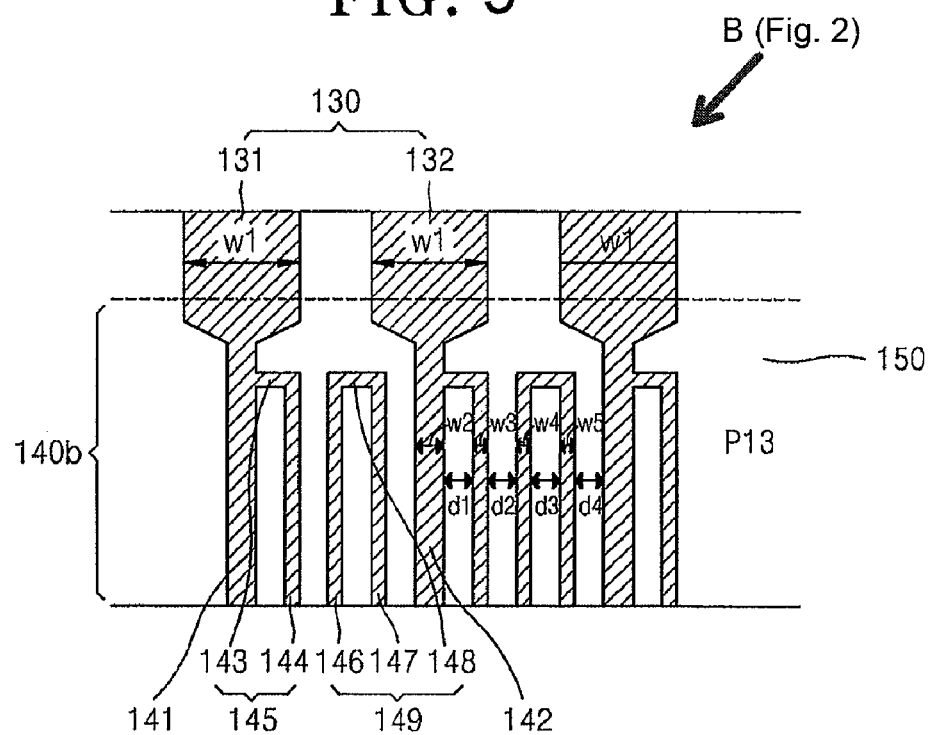
FIG. 9 is an enlarged image of a portion B of FIG. 2.

FIG. 9 is an enlarged image of a portion B of FIG. 2. Hereinafter, with reference to FIG. 9, the conductive line wiring portion 140b including the conductive lines disposed on the lower end portion P13 of the display panel P1 will be described in more detail.

The first conductive line 141 may extend directly from the end of the pad electrode 131 or 132 to the end of the substrate 110. The first conductive line 141 may extend so as to be substantially perpendicular to the end of the substrate 110 and may be cut at the end of the substrate 110. At this time, the pad electrodes 131, 132, . . . may be formed of the same material as first conductive lines 141 and 142. In the meantime, the first conductive lines 141 and 142 may correspond to the conductive lines 141 and 142 (see FIG. 12) disposed on the left end portion P12 of the display panel P1. The second conductive line 145 includes a connection portion 143 connected to the first conductive line 141 and an extension portion 144 extending from an end of the connection portion 143 to the end of the substrate 110. The extension portion 144 of the second conductive line 145 is disposed in substantially parallel to the first conductive line 141 at a predetermined interval "d I" and is cut at the end of the substrate 110. In addition, the second conductive line 145 may be formed of the same material as the pad electrode 131, 132, . . . or the first conductive line 141 and 142, and may be simultaneously formed with the pad electrode 131, 132, . . . or the first conductive line 141 and 142. In the FIG. 9 embodiment, the second conductive line 145 extends directly from the first conductive line 141, but the present invention is not limited thereto. Referring to FIG. 9, at least one third conductive line 149 is disposed between the second conductive line 145 and the adjacent first conductive line 142 that is the closest to the first conductive line 141 from among a plurality of first conductive lines.

The third conductive line 149 includes two extension portions, i.e., a first extension portion 146 and a second extension portion 147 which extend to the end of the substrate 110, and a connection portion 148 connecting the first and second extension portions 146 and 147. In this case, the first and second extension portions 146 and 147 and the connection portion 148 may be simultaneously formed of the same material. In addition, ends of the first and second extension portions 146 and 147 are cut at the end of the substrate 110.

The first and second extension portions 146 and 147 may be disposed in substantially parallel to the first conductive line 141 and the extension portion 144 of the second conductive line 145. In addition, the third conductive line 149 may be simultaneously formed of the same material as the second conductive line 145. The line width w3 of the second conductive line 145 may be the same as each of the width w4 and w5 of the first and second extension portions 146 and 147 of the third conductive line 149.

The connection portion 148 of the third conductive line 149 may connect the first and second extension portions 146 and 147, and may be disposed in substantially parallel to the end of the substrate 110. Thus, the first and second extension portions 146 and 147 of the third conductive line 149 are connected to the connection portion 148. However, the third conductive line 149 itself is electrically insulated from the second conductive line 145 and the adjacent first conducive line 142 that is the closest to the first conductive line 141 from among a plurality of first conductive lines.

In the FIG. 9 embodiment, a single third conductive line 149 is disposed between the first conductive line 141 and the adjacent first conductive line 142, but the present invention is not limited thereto. That is, although not illustrated in FIG. 9, it will be obvious to one of ordinary skill in the art that a plurality of third conductive lines having substantially the same pattern as in FIG. 9 may be disposed between the first conductive line 141 and the adjacent first conductive line 142.

The insulating layer 150 is disposed on the conductive line wiring portion 140b including the first through third conductive lines 141, 145 and 149. Also in FIG. 12 (enlarged image of a portion A of FIG. 2), the insulating layer 150 is disposed on the conductive line wiring portion 140b including the conductive lines 141 and 142.

The insulating layer 150 is formed of an insulating material, for example, SiO$_2$ and/or SiN$_x$ or the like. The insulating layer 150 insulates the first through third conductive lines 141, 145 and 149 of the conductive line wiring portion 140 from one another. Further, the layer 150 prevents the conductive line wiring portion 140 from being exposed directly to air. When the flexible printed circuit board (not shown) comes in contact with the display panel P1, the conductive line wiring portion 140 of the display panel P1 is prevented from being connected to pad electrodes or wirings, which are included in the flexible printed circuit board, thereby preventing a short circuit between the conductive line wiring portion 140 and the flexible printed circuit board.

In the FIG. 9 embodiment, the insulating layer 150 is disposed directly on the conductive line wiring portion 140, but the present invention is not limited thereto. For example, when the display panel P1 comes in contact with the flexible printed circuit board, a separate insulating layer may be disposed on the flexible printed circuit board except for the pad electrode thereof; which is connected directly to the pad electrode portion 130 of the display panel P1. In this embodiment, the separate insulating layer may insulate the conductive line wiring portion 140 from the pad electrode and wirings of the flexible printed circuit board.

Figure 10:
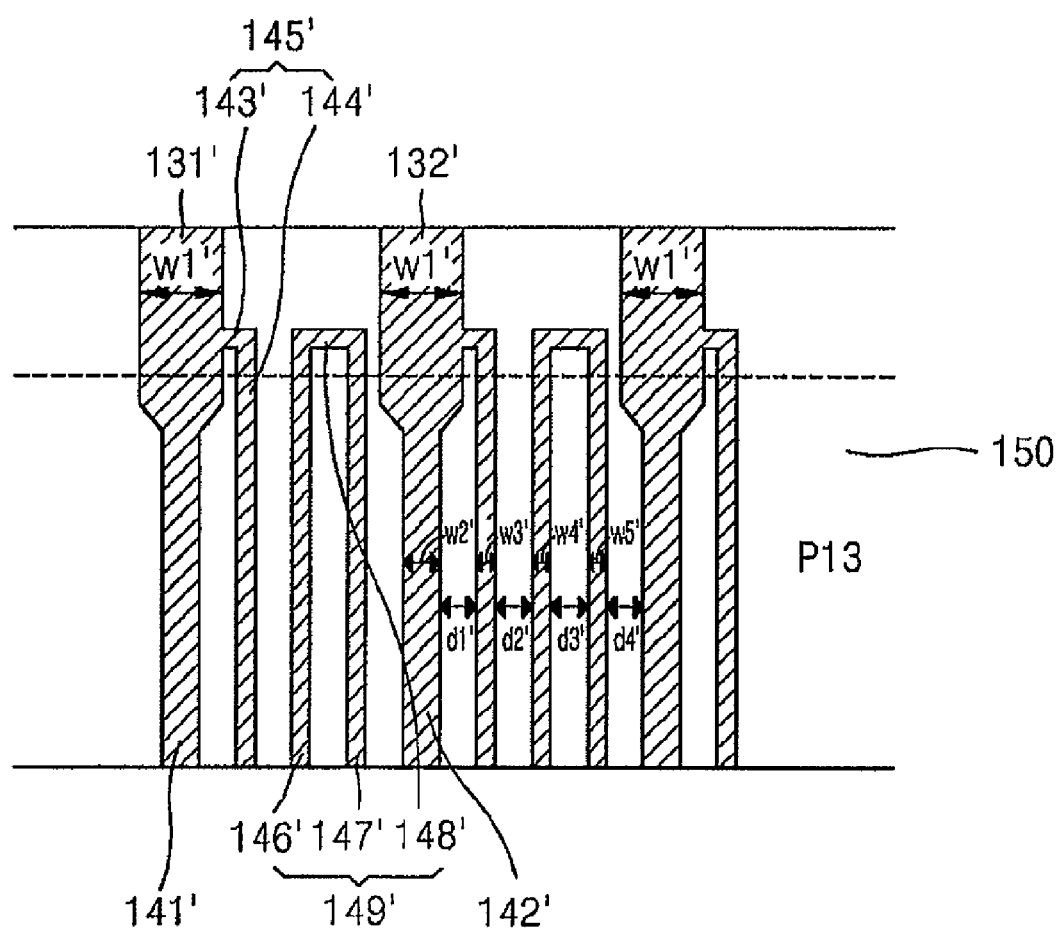
FIG. 10 is a plan view of a modified version of a conductive line wiring portion illustrated in FIG. 2.

FIG. 10 is a plan view of a modified version of the conductive line wiring portion 140 illustrated in FIG. 2. Referring to FIG. 10, a second conductive line 145' extends directly from a side portion of a pad electrode 131'. In FIG. 9, the second conductive line 145 is connected to the pad electrode 131 via the first conductive line 141. However, in FIG. 10, the second conductive line 145' is connected directly to the pad electrode 131'. In this case, the line width w1' of the pad electrode 131' may be smaller than the line width w1 of the pad electrode 131 of FIG. 9. In one embodiment, the line widths w2' and w3' of the first and second conductive lines 141' and 145', and an interval d1' between the first and second conductive lines 141' and 145' may be substantially the same as line widths w2 and w3, and an interval d1 of FIG. 9, respectively. In this embodiment, the line width w1' of the pad electrode 131' may be substantially the same as the line width w1 of the pad electrode 131 of FIG. 9. Also, a connection portion 143' of the second conductive line 145' illustrated in FIG. 10 may not be required.

The structure of FIG. 10 is similar to that of FIG. 9 in that a pad electrode, a first conductive line and a second conductive line are connected to one another, and the line widths of conductive lines and an interval between the conductive lines are substantially the same as those of the structure of FIG. 9.

Figure 12:
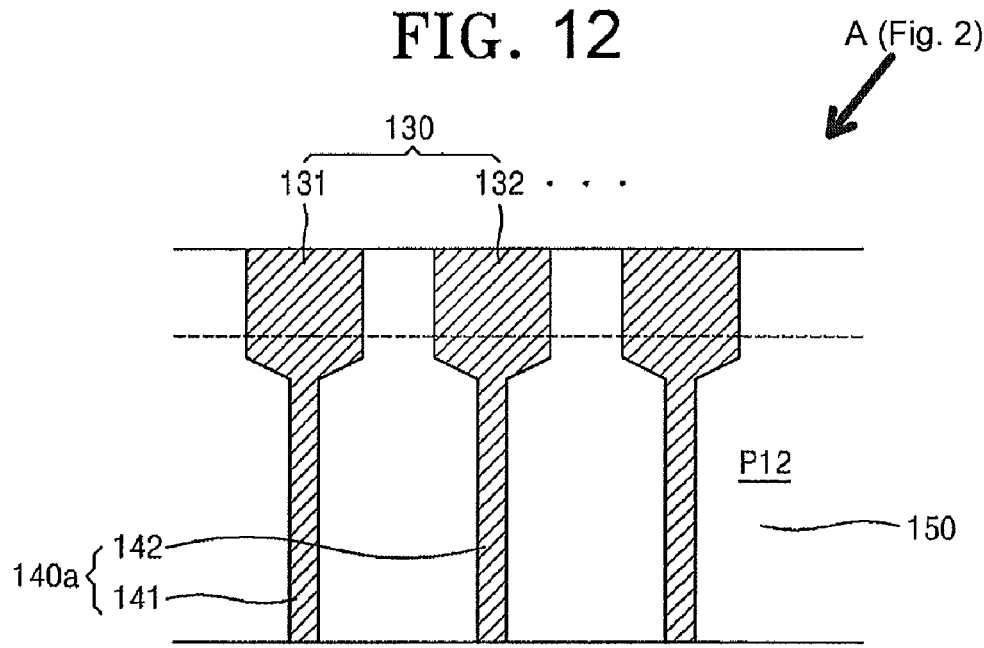
FIG. 12 an enlarged image of a portion A of FIG. 2.

Although not illustrated in FIGS. 2, 9 and 12, additional elements may be disposed on the display unit 120 if necessary. For example, when a display device such as a light emitting device, which is weak against moisture or oxygen, is used, a sealing member (not shown) may be further disposed in order to protect the display device from moisture or impurities. Of course, in the case of other display devices besides a light emitting device, a sealing member (not shown) may be disposed in order to protect the display devices.

FIG. 11 is an enlarged image of a portion C of FIG. 1, and schematically illustrates the pad electrode portion 130 and the conductive lines 140, which are formed on a left end portion P12 of the first display panel P1.

Referring to FIG. 11, the pad electrode portion 130 including the pad electrodes 131, 132, . . . is formed at the left end portion P12 of the first display panel PI. The conductive lines 141 and 142 are connected directly to the pad electrodes 131, 132, . . . , respectively, so as to extend to the scribing line SL of the mother glass 10. A conductive bar 180 connecting all ends of the conductive lines 141 and 142 is formed outside of the scribing line SL. As a result of the above structure, a constant voltage is generated on the pad electrode portion 130 and the conductive line wiring portion 140, thereby prevention static electricity from being generated during manufacturing the display panel PI.

According to at least one embodiment of the present invention, in a display panel and a mother glass including the display panel, damages due to static electricity can be prevented during manufacturing the display panel, and a short circuit can be prevented between channels of a display panel.

According to at least one embodiment of the present invention, in a display panel and a mother glass including the display panel, static electricity can be prevented, and a short circuit can be prevented when the display panel is misaligned to a flexible printed circuit board due to a scribing error and an error generated during coupling the display panel to the flexible printed circuit board. In addition, even if a conductive ball passes through an insulating layer due to a pressure applied during coupling the display panel to the flexible printed circuit board, a short circuit can be prevented.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A flat panel display apparatus, comprising:
   a flat panel having four peripheral sides, wherein the flat panel comprises a plurality of display elements;
   a first plurality of pad electrodes formed at one or more of the four sides of the flat panel, wherein the first plurality of pad electrodes are electrically connected to at least one of the plurality of display elements;
   a first plurality of conductive lines extending from the first plurality of pad electrodes, respectively, wherein the first plurality of conductive lines are electrically insulated from each other; and
   at least one intermediate electrode formed between two adjacent ones of the first plurality of conductive lines, wherein the at least one intermediate electrode is electrically isolated from the two adjacent conductive lines, and wherein the at least one intermediate electrode is not electrically connected to any of the pad electrodes.

2. The apparatus of claim 1, further comprising:
   a second plurality of conductive lines extending from either the first plurality of pad electrodes or the first plurality of conductive lines, respectively, wherein each of the second plurality of conductive lines is formed between two adjacent ones of the first plurality of conductive lines, and wherein each second conductive line is electrically insulated from the two adjacent conductive lines and the at least one intermediate electrode.

3. The apparatus of claim 2, wherein at least one of the second plurality of conductive lines comprises:
   a connection portion extending from one of i) a respective pad electrode and ii) a respective first conductive line in a first direction which is substantially parallel to one of the sides of the flat panel; and
   an extension portion extending from the connection portion in a second direction substantially perpendicular to the first direction.

4. The apparatus of claim 3, wherein each of the at least one intermediate electrode comprises:
   two extension portions spaced apart from each other and extending in the second direction, wherein the two extension portions are substantially parallel to each other, and wherein each of the two extension portions comprise two ends; and
   a connection portion extending in the first direction and connecting the two extension portions on each one of the two ends thereof.

5. The apparatus of claim 4, wherein the length of the two extension portions is substantially the same as that of the extension portion of the at least one second conductive line.

6. The apparatus of claim 4, wherein the width of the two extension portions is less than that of at least one first pad electrode.

7. The apparatus of claim 1, further comprising a flexible printed circuit board which comprises a second plurality of pad electrodes electrically connected to the first plurality of pad electrodes, respectively.

8. A method of manufacturing a plurality of flat panel display apparatuses, comprising:
   providing a mother glass comprising a plurality of display panels, wherein at least two of the display panels, comprising first and second display panels, are connected to each other, wherein the first display panel is electrically connected to a first plurality of pad electrodes, wherein the second display panel is electrically connected to a second plurality of pad electrodes, wherein the first and second plurality of pad electrodes are connected to each other via a first plurality of wiring portions, respectively, and wherein two adjacent ones of the first plurality of wiring portions are connected to each other via at least one second wiring portion; and
   cutting the mother glass, so as to separate the at least two display panels from each other, along a first scribing line which crosses i) the first plurality of wiring portions and ii) the at least one second wiring portion so that at least one intermediate electrode is formed of the at least one second wiring portion, wherein the at least one intermediate electrode is electrically isolated from and formed between the two adjacent first wiring portions, and wherein the at least one intermediate electrode is not electrically connected to any of the pad electrodes.

9. The method of claim 8, further comprising:
   providing a flexible printed circuit board comprising a third plurality of pad electrodes; and
   electrically connecting the third plurality of pad electrodes of the flexible printed circuit board to the first plurality of pad electrodes, respectively.

10. The method of claim 9, wherein all of the third plurality of pad electrodes are aligned with all of the corresponding first plurality of pad electrodes.

11. The method of claim 9, wherein at least one of the third plurality of pad electrodes is not aligned with at least one of the corresponding first plurality of pad electrodes.

12. The method of claim 9, further comprising:
   forming a conductive adhesive medium between the third plurality of pad electrodes of the flexible printed circuit board and the first plurality of pad electrodes, wherein the conductive adhesive medium contains a plurality of conductive balls;
   forming an insulation layer between the third plurality of pad electrodes of the flexible printed circuit board and the first plurality of wiring portions; and
   applying a pressure to the conductive adhesive medium so that at least part of the plurality of conductive balls penetrate into the insulation layer.

13. The method of claim 8, further comprising cutting the mother glass along a second scribing line which crosses i) the first plurality of conductive lines and ii) at least one second wiring portion, wherein the second scribing line deviates from the first scribing line.

14. A flat panel display apparatus, comprising:
   a flat panel comprising a plurality of display elements;
   a first plurality of pad electrodes formed at a periphery of the flat panel and electrically connected to at least one of the plurality of display elements;
   a first plurality of conductive lines extending from the first plurality of pad electrodes, respectively, wherein the first plurality of conductive lines are electrically insulated from each other; and
   a plurality of intermediate electrodes, each formed between two adjacent ones of the first plurality of conductive lines, wherein the intermediate electrodes are electrically isolated from the two adjacent conductive lines, and wherein each of the intermediate electrodes is not electrically connected to any of the pad electrodes.

15. The apparatus of claim 14, wherein a short circuit is prevented between a flexible printed circuit board and at least one of the plurality of display elements.

16. The apparatus of claim 15, wherein the intermediate electrodes are configured to prevent the short circuit generated from a misalignment between at least one of the first plurality of pad electrodes and at least one of the corresponding pad electrodes of the flexible printed circuit board.

17. The apparatus of claim 16, wherein the intermediate electrodes are configured to prevent a short circuit generated from a pressure applied to the flexible printed circuit board which causes one or more of a plurality of conductive balls to penetrate into an insulation layer on the flat panel display apparatus.

18. The apparatus of claim 14, further comprising a flexible printed circuit board which comprises a third plurality of pad electrodes which are electrically connected to the first plurality of pad electrodes, respectively.

19. The apparatus of claim 18, further comprising:
a conductive adhesive medium formed between the third plurality of pad electrodes of the flexible printed circuit board and the first plurality of pad electrodes, wherein the conductive adhesive medium contains a plurality of conductive balls; and
an insulation layer formed between the third plurality of pad electrodes of the flexible printed circuit board and the first plurality of conductive lines.

20. The apparatus of claim 14, wherein the intermediate electrodes comprise at least one intermediate electrode electrically insulated from the two adjacent conductive lines.

* * * * *